United States Patent
Chuang

(10) Patent No.: US 12,185,555 B2
(45) Date of Patent: Dec. 31, 2024

(54) SEMICONDUCTOR MEMORY DEVICE MANUFACTURING METHOD

(71) Applicant: NANYA TECHNOLOGY CORPORATION, New Taipei (TW)

(72) Inventor: Ying-Cheng Chuang, Taoyuan (TW)

(73) Assignee: NANYA TECHNOLOGY CORPORATION, New Taipei (TW)

(*) Notice: Subject to any disclaimer, the term of this patent is extended or adjusted under 35 U.S.C. 154(b) by 316 days.

(21) Appl. No.: 17/823,512

(22) Filed: Aug. 30, 2022

(65) Prior Publication Data

US 2024/0074215 A1    Feb. 29, 2024

(51) Int. Cl.
*H10B 99/00*    (2023.01)
*H10B 12/00*    (2023.01)

(52) U.S. Cl.
CPC .......... *H10B 99/00* (2023.02); *H10B 12/488* (2023.02)

(58) Field of Classification Search
CPC ....... H10B 12/488; H10B 99/00; H10B 99/22
See application file for complete search history.

(56) References Cited

U.S. PATENT DOCUMENTS 6,168,992 B1 *    1/2001    Lee .............. H10B 12/033
                                                 438/399

* cited by examiner

*Primary Examiner* — Thanhha S Pham
(74) *Attorney, Agent, or Firm* — CKC & Partners Co., LLC

(57) ABSTRACT

A semiconductor memory device manufacturing method includes: sequentially forming a lower oxide layer, a word line metal layer and an upper oxide layer over at least a portion of a memory cell; forming a through hole passing through the upper oxide layer, the word line metal layer and the lower oxide layer to expose the portion of the memory cell; forming a sacrificial pillar into the through hole; removing the upper oxide layer to expose a top portion of the sacrificial pillar; sequentially forming a first oxide spacer sidewall, a nitride spacer sidewall and a second oxide spacer sidewall on a sidewall of the top portion of the sacrificial pillar; removing the nitride spacer sidewall to form a void gap; etching the word line metal layer through the void gap to form separate word lines.

20 Claims, 10 Drawing Sheets

SEMICONDUCTOR MEMORY DEVICE MANUFACTURING METHOD

BACKGROUND

Field of Disclosure

The present disclosure relates to a semiconductor memory device manufacturing method.

Description of Related Art

An integrated circuit (IC) device (also referred to as a semiconductor chip) can contain millions of transistors and other circuit elements that are fabricated on a single silicon crystal substrate (wafer). For the IC device to be functional, a complex network of signal paths will normally be routed to connect the circuit elements distributed on the surface of the device. Efficient routing of these signals across the device can become more difficult as the complexity and number of circuit elements are increased.

SUMMARY

The present disclosure provides semiconductor manufacturing methods to deal with the needs of the prior art problems.

In one or more embodiments, a semiconductor memory device manufacturing method includes: sequentially forming a lower oxide layer, a word line metal layer and an upper oxide layer over at least a portion of a memory cell; etching at least one through hole passing through the upper oxide layer, the word line metal layer and the lower oxide layer to expose the portion of the memory cell; forming at least one sacrificial pillar into the at least one through hole; removing the upper oxide layer to expose a top portion of the at least one sacrificial pillar; sequentially forming a first oxide spacer sidewall, a nitride spacer sidewall and a second oxide spacer sidewall on a sidewall of the top portion of the at least one sacrificial pillar; removing the nitride spacer sidewall to form a void gap; etching the word line metal layer through the void gap to form separate word lines.

In one or more embodiments, the nitride spacer sidewall is disposed between the first oxide spacer sidewall and the second oxide spacer sidewall.

In one or more embodiments, the first oxide spacer sidewall is disposed between the nitride spacer sidewall and the sidewall of the top portion of the at least one sacrificial pillar.

In one or more embodiments, the nitride spacer sidewall is formed by using an atomic layer deposition process.

In one or more embodiments, the word line metal layer is made from tungsten.

In one or more embodiments, the at least one sacrificial pillar is made from polysilicon.

In one or more embodiments, the method further including removing the at least one sacrificial pillar to expose the portion of the memory cell; and forming another portion of the memory cell to join the portion of the memory cell.

In one or more embodiments, the memory cell includes an indium gallium zinc oxide layer.

In one or more embodiments, the memory cell includes an indium gallium zinc oxide layer disposed between two indium tin oxide layers.

In one or more embodiments, the word line metal layer is formed to have a thickness ranging from 40 nanometers to 50 nanometers.

In one or more embodiments, a semiconductor memory device manufacturing method includes: sequentially forming a lower oxide layer, a word line metal layer and an upper oxide layer over lower portions of a plurality of memory cells; etching through holes passing through the upper oxide layer, the word line metal layer and the lower oxide layer to expose the lower portions of the plurality of memory cells respectively; forming sacrificial pillars into the through holes respectively; removing the upper oxide layer to expose top portions of the sacrificial pillars; sequentially forming first oxide spacer sidewalls and nitride spacer sidewalls on sidewalls of the top portions of the sacrificial pillars; forming second oxide spacer sidewalls to fill in first void gaps between adjacent-two of the nitride spacer sidewalls; removing the nitride spacer sidewalls to form second void gaps; and etching the word line metal layer through the second void gaps to form separate word lines.

In one or more embodiments, each nitride spacer sidewall is disposed between an immediately-adjacent one of the first oxide spacer sidewalls and an immediately-adjacent one of the second oxide spacer sidewalls.

In one or more embodiments, each first oxide spacer sidewall is disposed between an immediately-adjacent one of the nitride spacer sidewalls and an immediately-adjacent one of the sidewalls of the top portions of the sacrificial pillars.

In one or more embodiments, the nitride spacer sidewalls are formed by using an atomic layer deposition process.

In one or more embodiments, the word line metal layer is made from tungsten.

In one or more embodiments, the sacrificial pillars are made from polysilicon.

In one or more embodiments, the method further includes: removing the sacrificial pillars to expose the lower portions of the plurality of memory cells; and forming upper portions of the plurality of memory cells to join the lower portions of the plurality of memory cells respectively.

In one or more embodiments, each memory cell includes an indium gallium zinc oxide layer.

In one or more embodiments, each memory cell includes an indium gallium zinc oxide layer disposed between two indium tin oxide layers.

In one or more embodiments, the word line metal layer is formed to have a thickness of about 46 nanometers.

In sum, the semiconductor memory device manufacturing method disclosed herein using oxide and nitride spacers around the polysilicon pillars to define word line metal layers. The nitride spacers may be formed using an atomic layer deposition process to control a layer thickness precisely. An enhanced self-aligned word line process utilizes different material spacers to precisely pattern word line metal layers to form separate word lines with balanced widths.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
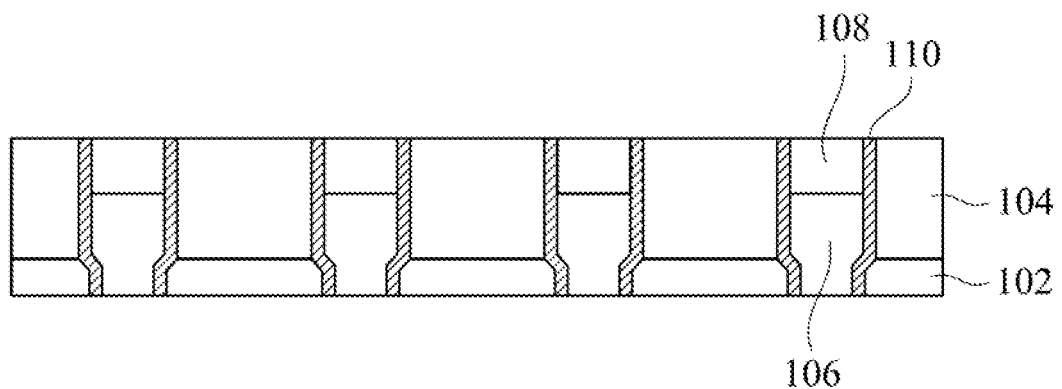
FIGS. 1-19 illustrate partial cross sections of manufacturing steps of a semiconductor memory device according to some embodiments of the present disclosure.

Reference will now be made in detail to the present embodiments of the disclosure, examples of which are illustrated in the accompanying drawings. Wherever possible, the same reference numbers are used in the drawings and the description to refer to the same or like parts.

Reference is made to FIG. 1, which illustrates a partial cross sectional view of a first manufacturing step according to some embodiments of the present disclosure. An oxide layer 102 is formed over a semiconductor substrate. In some embodiments of the present disclosure, the oxide layer 102 may be a silicon oxide layer. In some embodiments of the present disclosure, the oxide layer 102 may include at least one of hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide. In some embodiments of the present disclosure, the oxide layer 102 may be deposited by any suitable method, such as CVD, plasma-enhanced CVD (PECVD).

A nitride layer 104 is formed over and in contact with a top surface of the oxide layer 102. In some embodiments of the present disclosure, the nitride layer 104 may be silicon nitride layer formed in contact with the top surface of the of the oxide layer 102. In some embodiments of the present disclosure, the nitride layer 104 may be deposited by any suitable method, such as CVD, plasma-enhanced CVD (PECVD).

An etching process may be performed to form a plurality of through holes in the oxide layer 102 and the nitride layer 104. A lower portion of a memory cell is formed inside each through hole. The lower portion of a memory cell may include a polysilicon layer 106 and a bottom indium tin oxide layer 108 in contact with a top surface of the polysilicon layer 106. A dielectric spacer 110 may be formed to surround a sidewall of each lower portion of each memory cell. In some embodiments of the present disclosure, the dielectric spacer 110 may include at least one of hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide. In some embodiments of the present disclosure, the bottom indium tin oxide layer 108 may be deposited by any suitable method, such as PVD or plasma-enhanced PVD.

Figure 2:
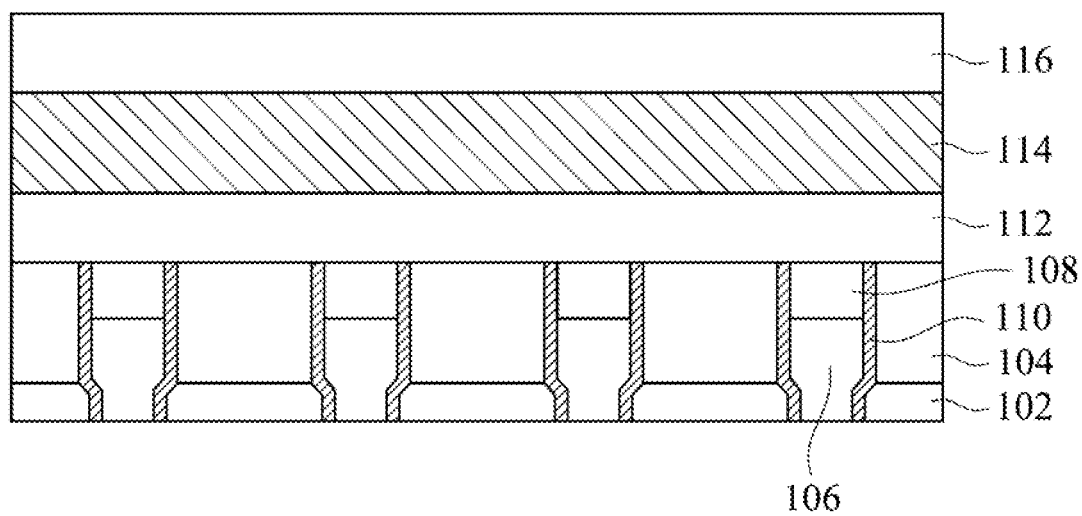

Reference is made to FIG. 2, which illustrates a partial cross sectional view of a second manufacturing step according to some embodiments of the present disclosure. A lower oxide layer 112 is formed over the lower portions of the memory cells and a top surface of the nitride layer 104. In some embodiments of the present disclosure, the lower oxide layer 112 may be formed to have a thickness of about 30 nanometers. In some embodiments of the present disclosure, the lower oxide layer 112 may be a silicon oxide layer. In some embodiments of the present disclosure, the lower oxide layer 112 may include at least one of hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide. In some embodiments of the present disclosure, the lower oxide layer 112 may be deposited by any suitable method, such as CVD, plasma-enhanced CVD (PECVD).

A patterned word line metal layer 114 is formed over the lower oxide layer 30. In some embodiments of the present disclosure, the metal layer 114 may be formed from tungsten (W) and to have a thickness ranging from about 40 nanometers to about 50 nanometers. In some embodiments of the present disclosure, the metal layer 114 may be formed from tungsten (W) and to have a thickness of about 46 nanometers. In some embodiments of the present disclosure, the metal layer 114 may be formed using metals and/or metal alloys such as aluminum (Al), titanium (Ti), cobalt (Co), silver (Ag), gold (Au), copper (Cu), nickel (Ni), chromium (Cr), hafnium (Hf), ruthenium (Ru), platinum (Pt), alloys thereof, or the like.

An upper oxide layer 116 is then formed over the metal layer 114. In some embodiments of the present disclosure, the lower oxide layer 112 may be formed to have a thickness of about 60 nanometers. In some embodiments of the present disclosure, the upper oxide layer 116 may be a silicon oxide layer. In some embodiments of the present disclosure, the upper oxide layer 116 may include at least one of hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide. In some embodiments of the present disclosure, the upper oxide layer 116 may be deposited by any suitable method, such as CVD, plasma-enhanced CVD (PECVD). The metal layer 114 is sandwiched between the lower oxide layer 112 and the upper oxide layer 116 to form a layer stack.

Figure 3:
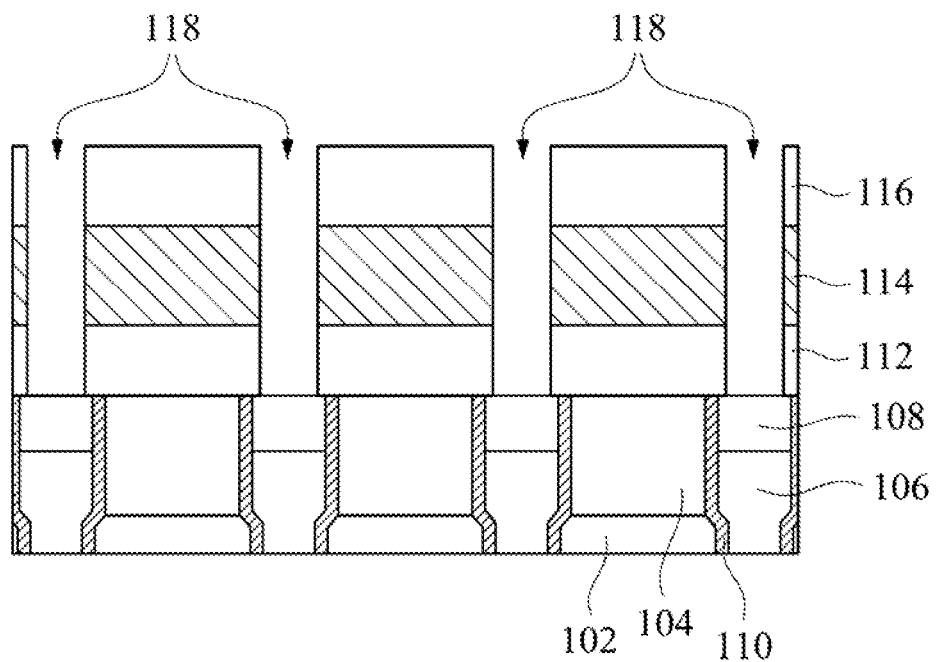

Reference is made to FIG. 3, which illustrates a partial cross sectional view of a third manufacturing step according to some embodiments of the present disclosure. A channel etch process is performed to form through holes 118 in the layer stack of the upper oxide layer 116, the metal layer 114 and the lower oxide layer 112 to expose a top of the lower portions of the memory cells, i.e., the bottom indium tin oxide layer 108.

Figure 4:
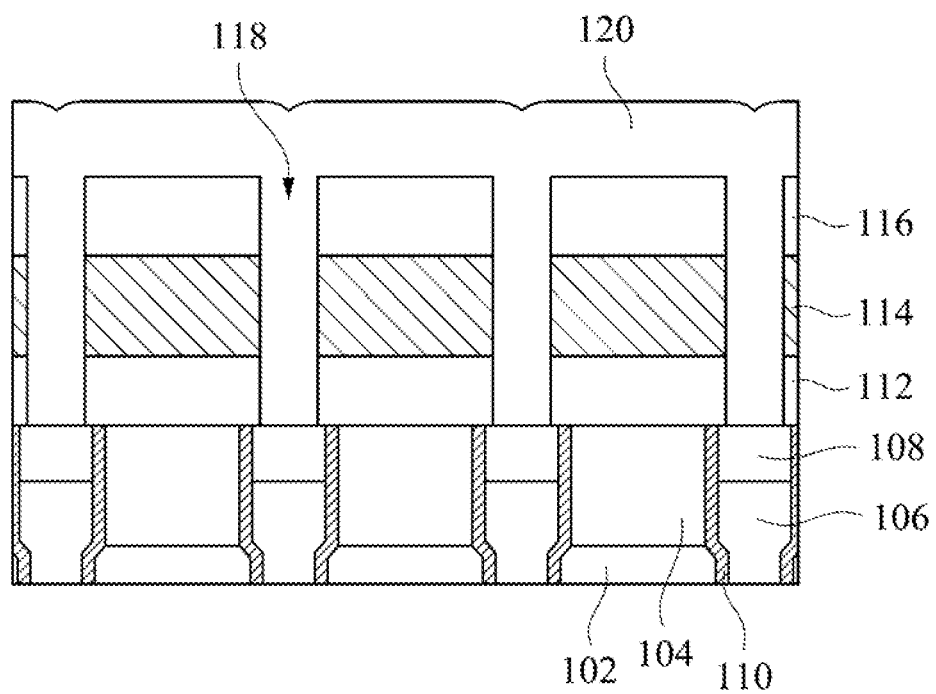

Reference is made to FIG. 4, which illustrates a partial cross sectional view of a fourth manufacturing step according to some embodiments of the present disclosure. A sacrificial polysilicon layer 120 is deposited over the upper oxide layer 116 and filled into through holes 118.

Figure 5:
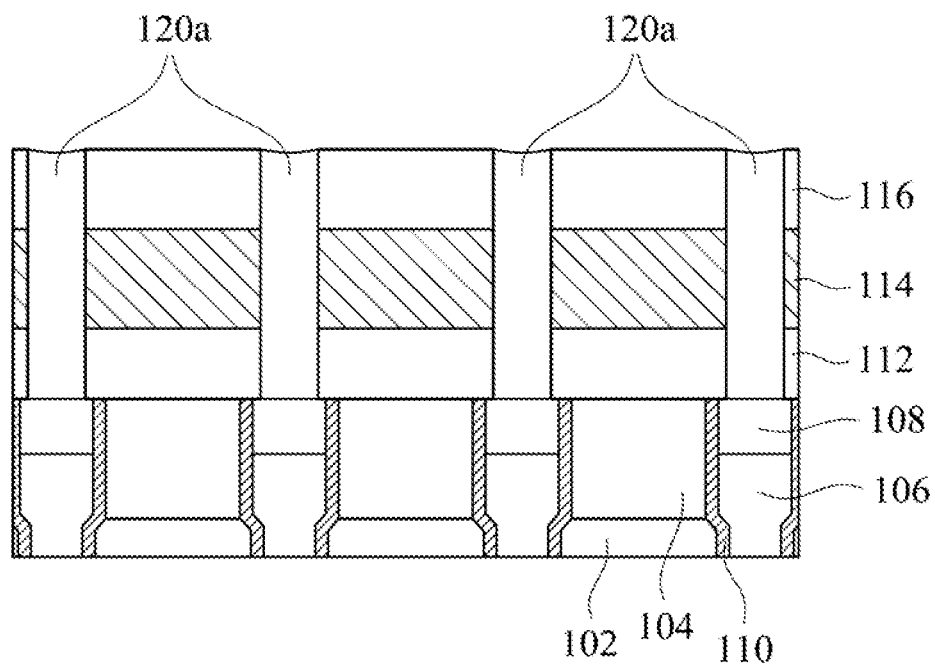

Reference is made to FIG. 5, which illustrates a partial cross sectional view of a fifth manufacturing step according to some embodiments of the present disclosure. A planarization process, e.g., a chemical mechanical polishing, may be formed to remove excess polysilicon materials, and polysilicon pillars 120a are formed in the through holes 118 respectively. Each polysilicon pillar 120a has its bottom in contact with the top of the lower portions of the memory cells, i.e., the bottom indium tin oxide layer 108.

Figure 6:
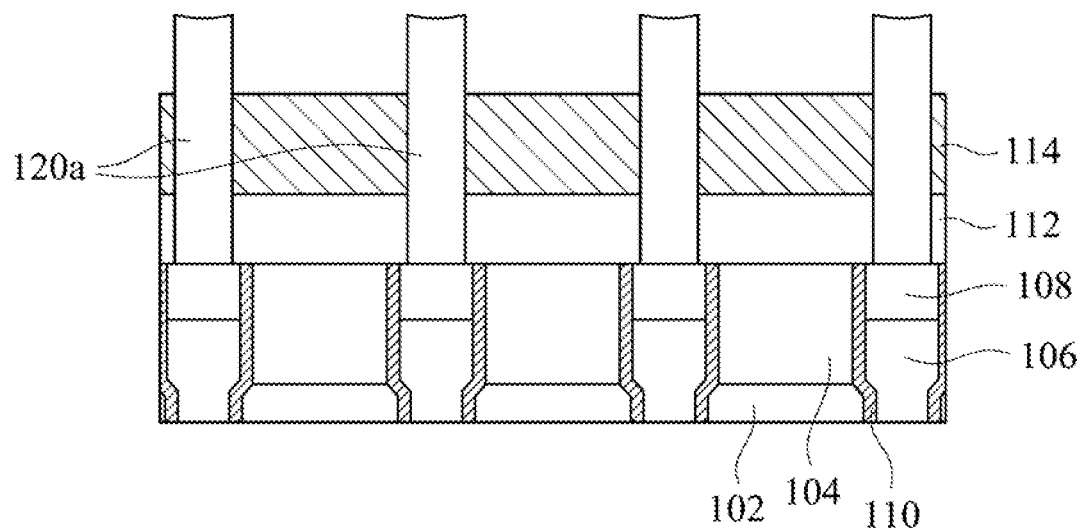

Reference is made to FIG. 6, which illustrates a partial cross sectional view of a sixth manufacturing step according to some embodiments of the present disclosure. An etch process is performed to remove the upper oxide layer 116, and a top surface of the metal layer 114 and top portions 120b of the polysilicon pillar 120a are exposed.

Figure 7:
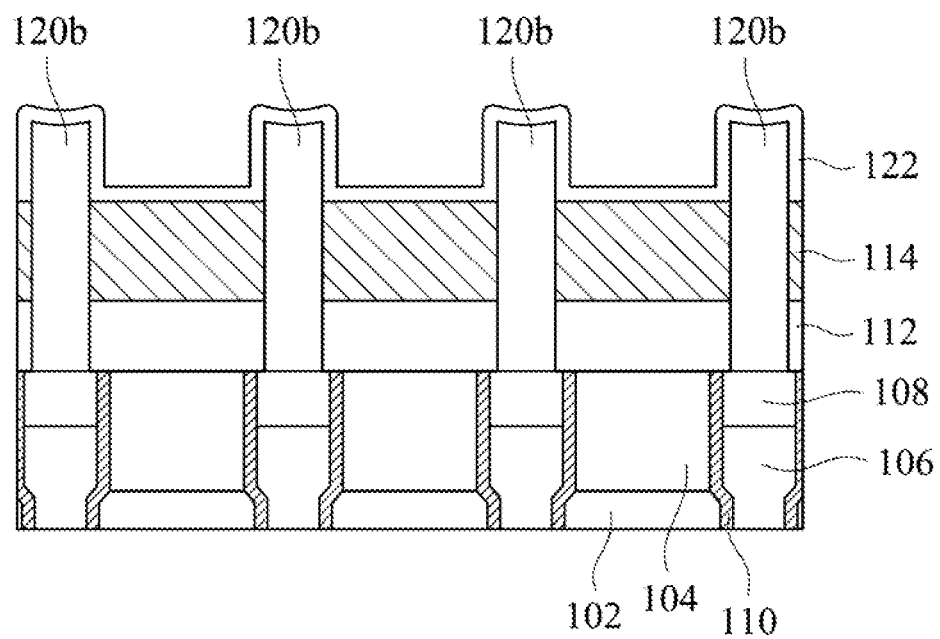

Reference is made to FIG. 7, which illustrates a partial cross sectional view of a seventh manufacturing step according to some embodiments of the present disclosure. A spacer oxide layer 122 is deposited to cover all exposed surfaces of the metal layer 114 and top portions 120b of the polysilicon pillar 120a. In some embodiments of the present disclosure, the spacer oxide layer 122 may be formed to have a thickness of about 5 to about 10 nanometers. In some embodiments of the present disclosure, the spacer oxide layer 122 may be deposited by any suitable method, such as CVD, plasma-enhanced CVD (PECVD).

Figure 8:
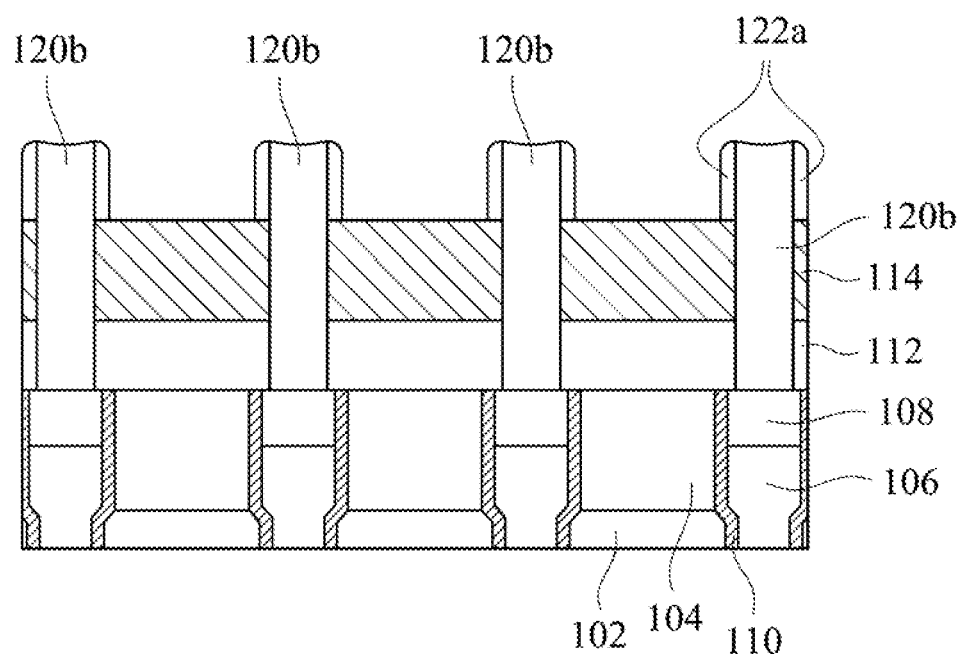

Reference is made to FIG. 8, which illustrates a partial cross sectional view of a eighth manufacturing step according to some embodiments of the present disclosure. An etch process is performed to remove portions of the spacer oxide layer 122 over the metal layer 114 and over top surfaces of the top portions 120b of the polysilicon pillar 120a such that oxide spacer sidewalls 122a are remained on sidewalls of the top portions 120b of the polysilicon pillar 120a.

Figure 9:
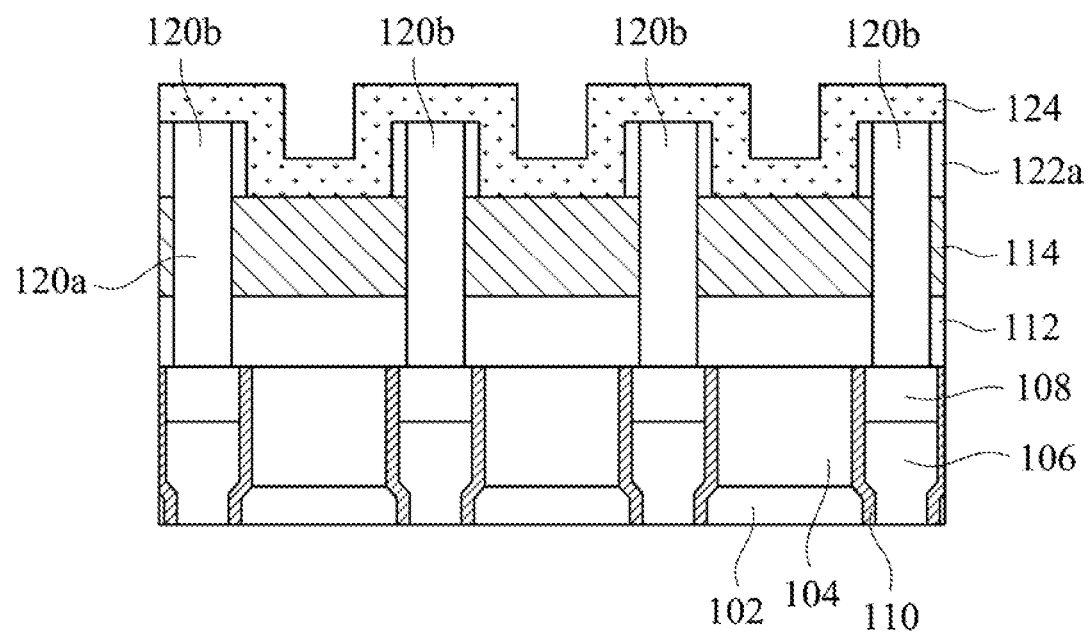

Reference is made to FIG. 9, which illustrates a partial cross sectional view of a ninth manufacturing step according to some embodiments of the present disclosure. A spacer nitride layer 124 is deposited to cover all exposed surfaces of the oxide spacer sidewalls 122a, the metal layer 114 and the top portions 120b of the polysilicon pillar 120a. In some embodiments of the present disclosure, the spacer nitride layer 124 may be formed using an atomic layer deposition process to control a layer thickness precisely. In some embodiments of the present disclosure, the spacer nitride layer 124 may include silicon nitride.

Figure 10:
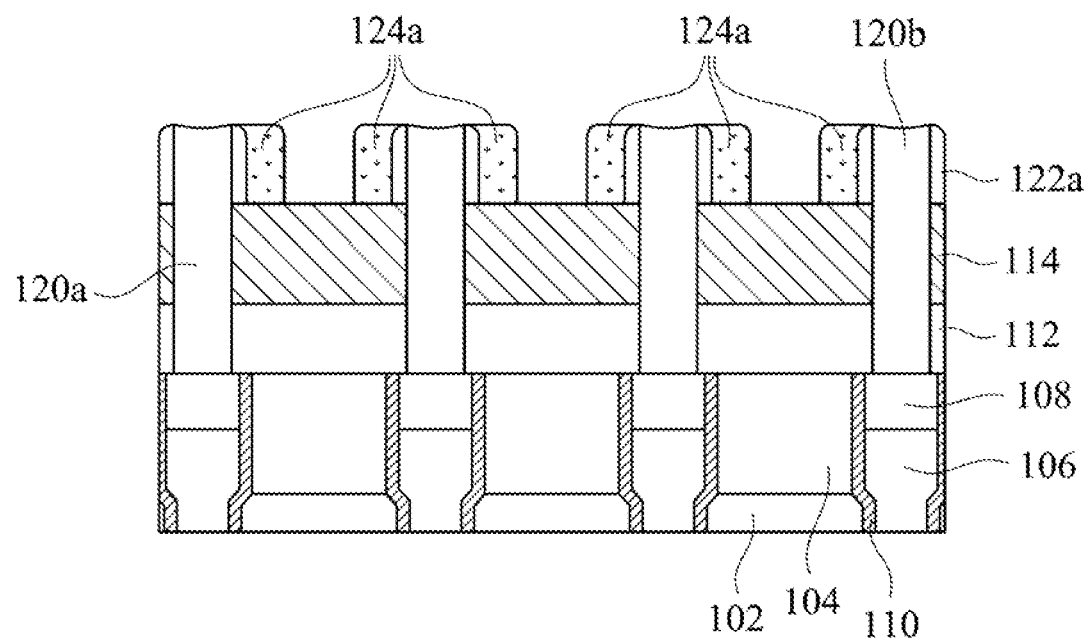

Reference is made to FIG. 10, which illustrates a partial cross sectional view of a tenth manufacturing step according to some embodiments of the present disclosure. An etch process is performed to remove portions of the spacer nitride layer 124 on the metal layer 114 and top surfaces of the top portions 120b of the polysilicon pillar 120a such that nitride spacer sidewalls 124a are remained on the oxide spacer sidewalls 122a and sidewalls of the top portions 120b of the polysilicon pillar 120a. Each oxide spacer sidewalls 122a is located between its immediately-adjacent nitride spacer sidewall 124a and immediately-adjacent top portion 120b of the polysilicon pillars 120a.

Figure 11:
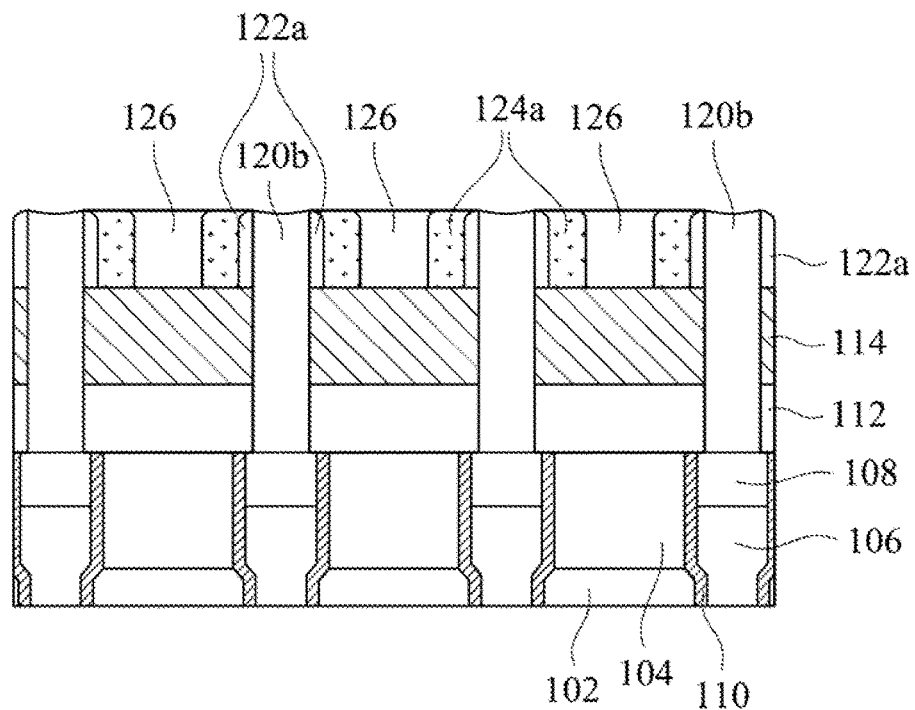

Reference is made to FIG. 11, which illustrates a partial cross sectional view of a eleventh manufacturing step according to some embodiments of the present disclosure. An oxide layer 126 is deposited into void gap between two neighboring nitride spacer sidewalls 124a. The oxide layer 126 may be referred as another oxide spacer sidewall. Each nitride spacer sidewalls 124a is sandwiched between neighboring oxide layer 126 and the oxide spacer sidewall. A planarization process, e.g., a chemical mechanical polishing, may be formed to remove excess oxide materials. In some embodiments of the present disclosure, the oxide layer 126 and the oxide spacer sidewalls 122a may be made from the same or substantially the same oxide materials. In some embodiments of the present disclosure, the oxide layer 126 may be deposited by any suitable method, such as CVD, plasma-enhanced CVD (PECVD).

Figure 12:
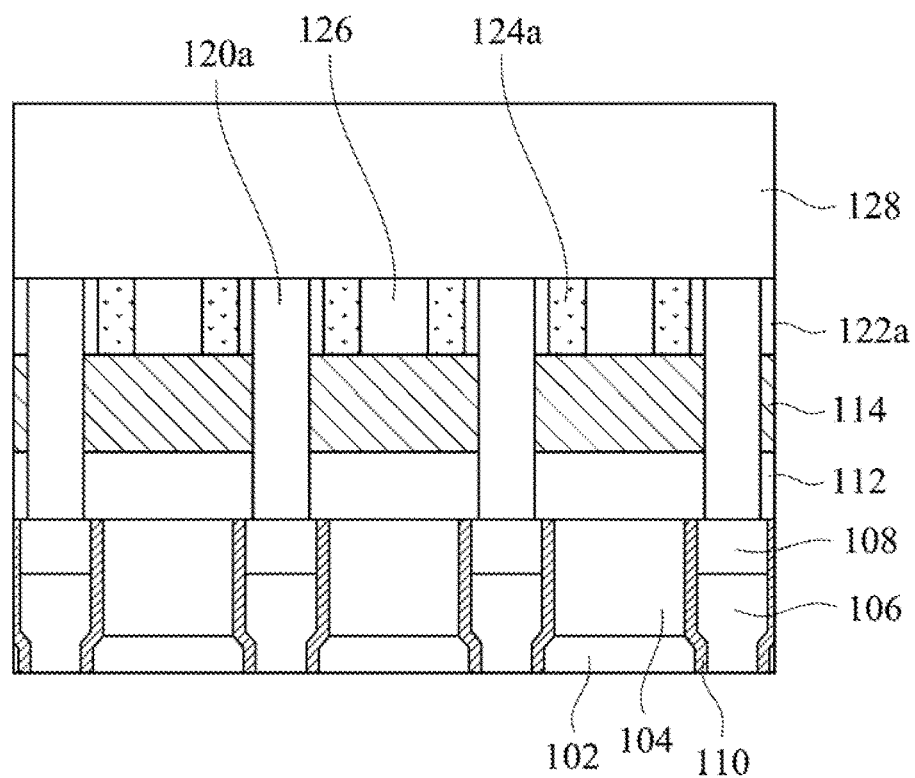

Reference is made to FIG. 12, which illustrates a partial cross sectional view of a twelfth manufacturing step according to some embodiments of the present disclosure. A carbon layer 128 is deposited over the polished top surfaces of the polysilicon pillars 120a, the nitride spacer sidewalls 124a, the oxide layers 126 and the oxide spacer sidewalls 122a.

Figure 13:
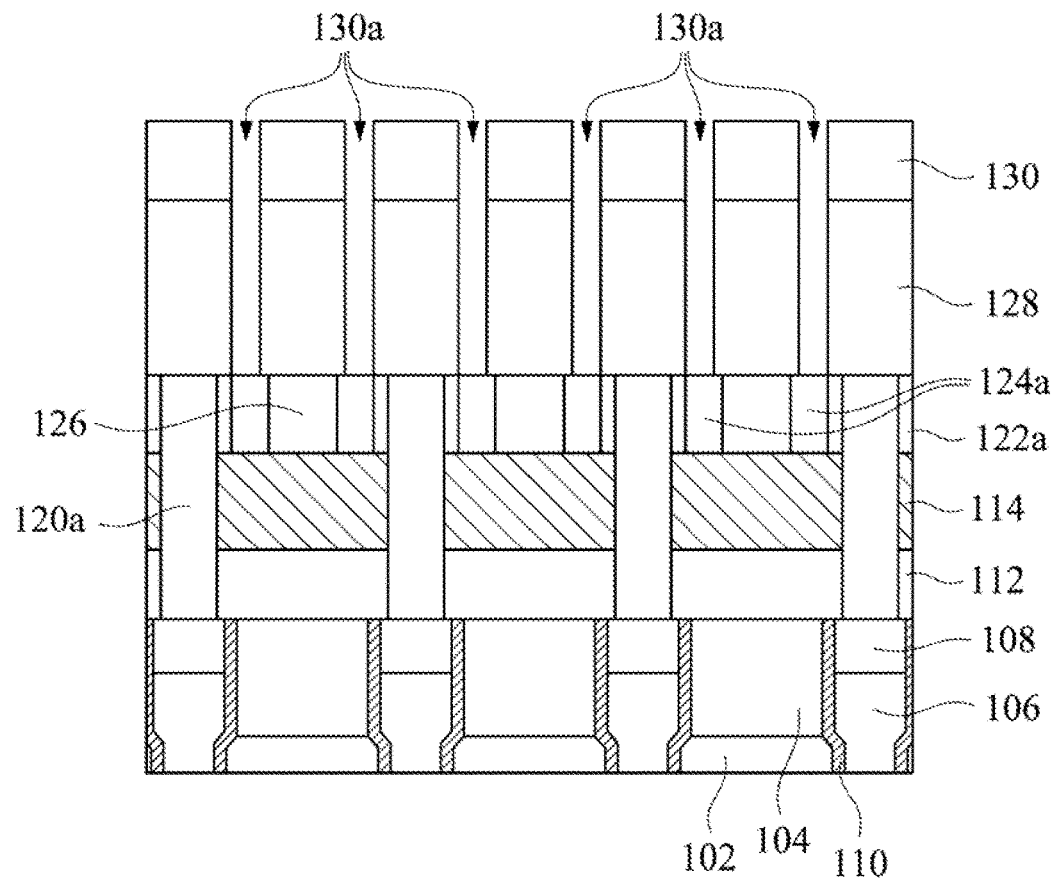

Reference is made to FIG. 13, which illustrates a partial cross sectional view of a thirteenth manufacturing step according to some embodiments of the present disclosure. A photoresist layer 130 is deposited over the carbon layer 128 and patterned by a lithography process to form openings 130a. An etching process is performed using the patterned photoresist layer 130 as a mask to pattern the carbon layer 128. Each opening 130a is aligned with and configured to expose a corresponding nitride spacer sidewall 124a underneath.

Figure 14:
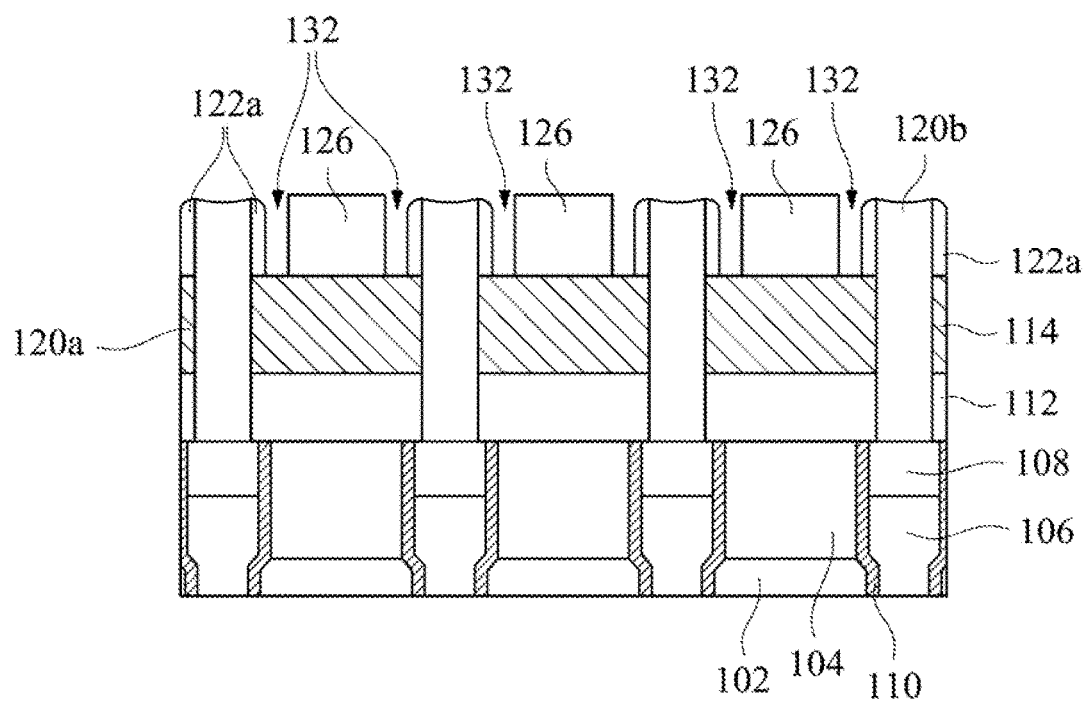

Reference is made to FIG. 14, which illustrates a partial cross sectional view of a fourteenth manufacturing step according to some embodiments of the present disclosure. A further etching process is performed using the patterned carbon layer 128 as a mask to remove nitride spacer sidewalls 124a. After removing the nitride spacer sidewalls 124a, the remaining photoresist layer 130 and carbon layer 128 are also removed. Void gaps 132 are formed between neighboring oxide layer 126 and oxide spacer sidewall 122a.

Figure 15:
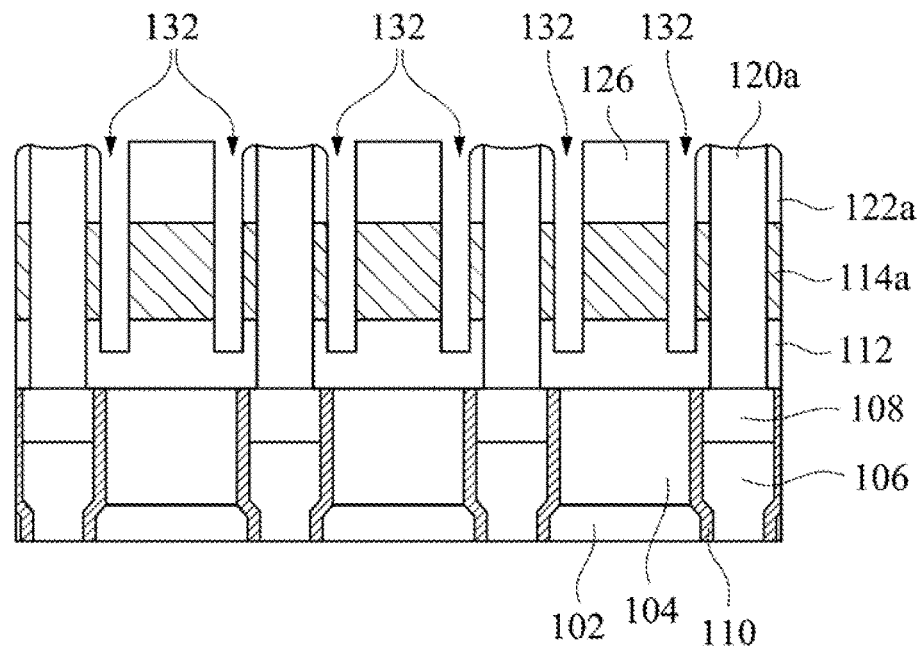

Reference is made to FIG. 15, which illustrates a partial cross sectional view of a fifteenth manufacturing step according to some embodiments of the present disclosure. An etching process is performed using the remained oxide layers 126 and remained oxide spacer sidewalls 122a as mask to pattern the metal layer 114, i.e., to form void gaps 132 to define separate word lines 114a.

Figure 16:
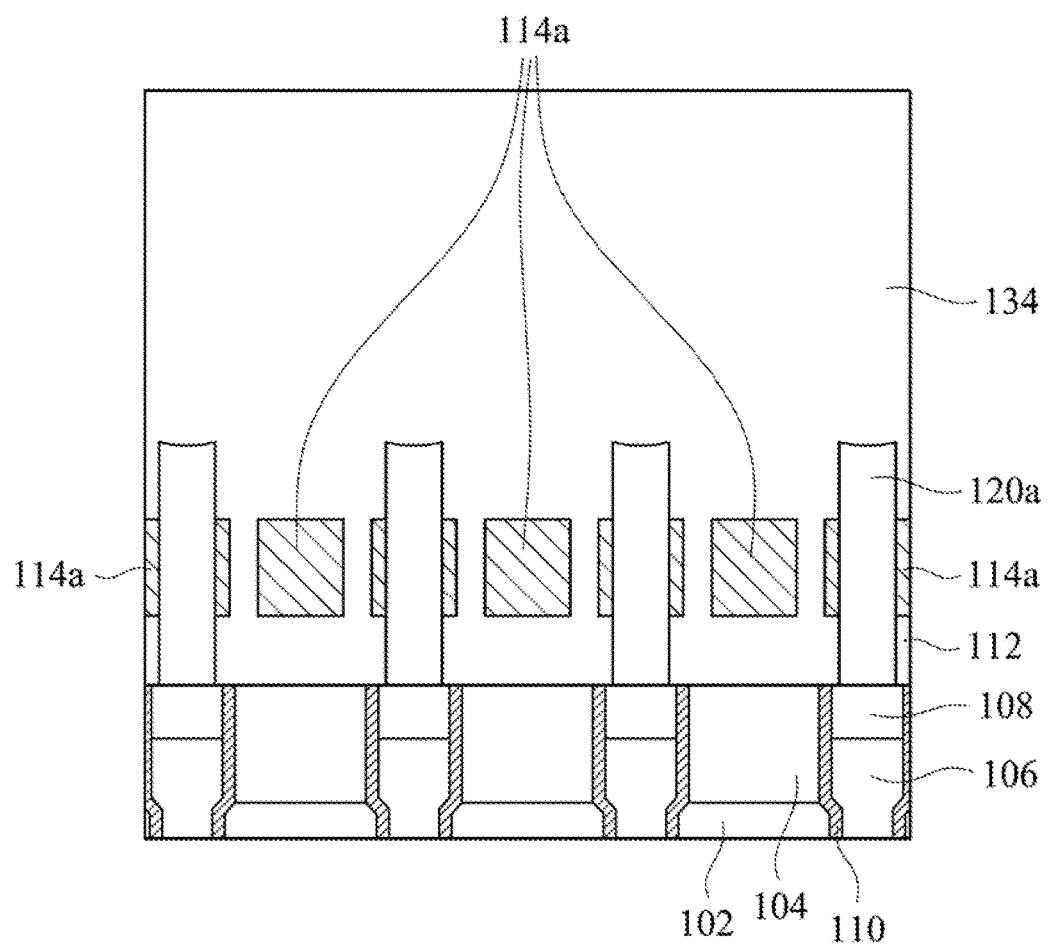

Reference is made to FIG. 16, which illustrates a partial cross sectional view of a sixteenth manufacturing step according to some embodiments of the present disclosure. An oxide layer 134 is deposited over the remained oxide layers 126 and remained oxide spacer sidewalls 122a and filled into void gaps 132 among the word lines 114a (also referring to FIG. 15). In some embodiments of the present disclosure, the oxide layer 134, the oxide layer 126 and the oxide spacer sidewalls 122a may be made from the same or substantially the same oxide materials such that all oxide layers (134, 126, 122a) are illustrated without interfaces in FIGS. 16-19. In some embodiments of the present disclosure, the oxide layer 134 may be deposited by any suitable method, such as CVD, plasma-enhanced CVD (PECVD).

Figure 17:
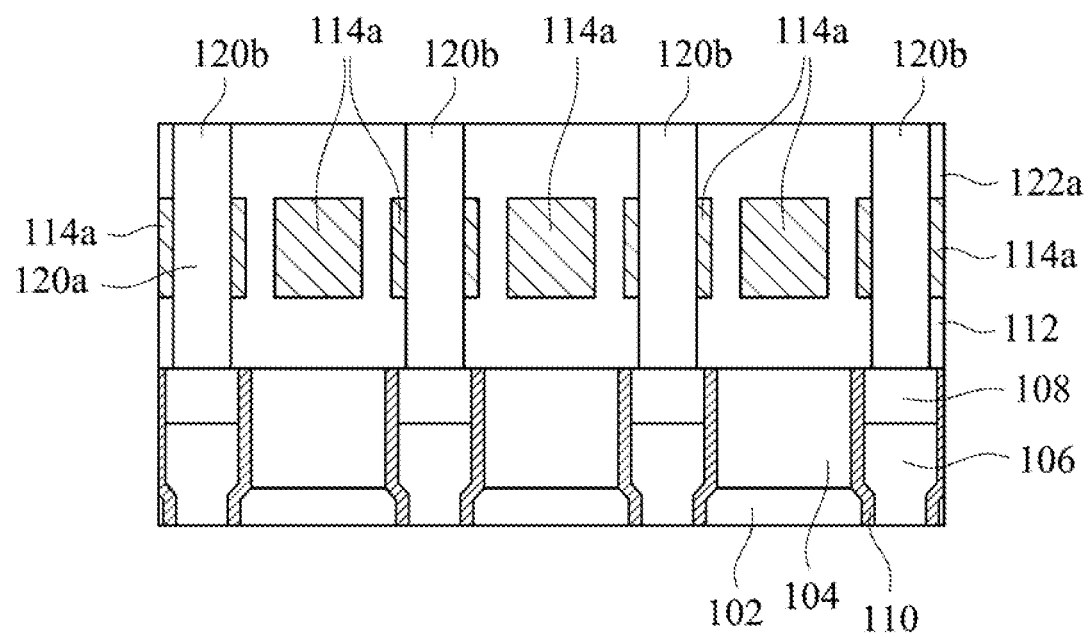

Reference is made to FIG. 17, which illustrates a partial cross sectional view of a seventeenth manufacturing step according to some embodiments of the present disclosure. A planarization process, e.g., a chemical mechanical polishing, may be formed to remove excess oxide materials of the oxide layer 134 until top portions 120b of the polysilicon pillars 120a are exposed.

Figure 18:
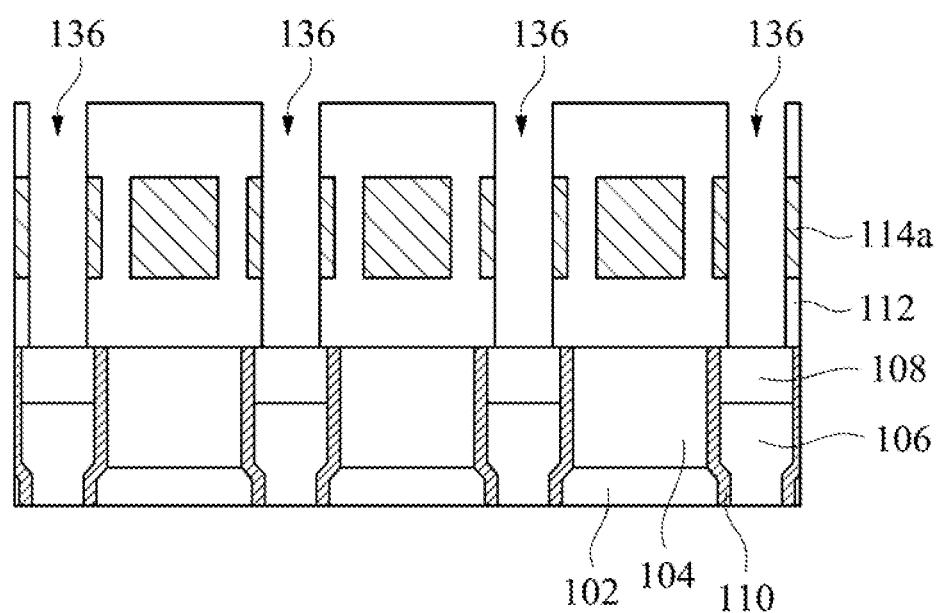

Reference is made to FIG. 18, which illustrates a partial cross sectional view of a eighteenth manufacturing step according to some embodiments of the present disclosure. An etching process is performed to remove the polysilicon pillars 120a and not to remove oxide materials, which surround the polysilicon pillars 120a, to form openings 136. A top portion (i.e., the bottom indium tin oxide layer 108) of the lower portion of the memory cell is exposed at a bottom of each opening 136.

Figure 19:
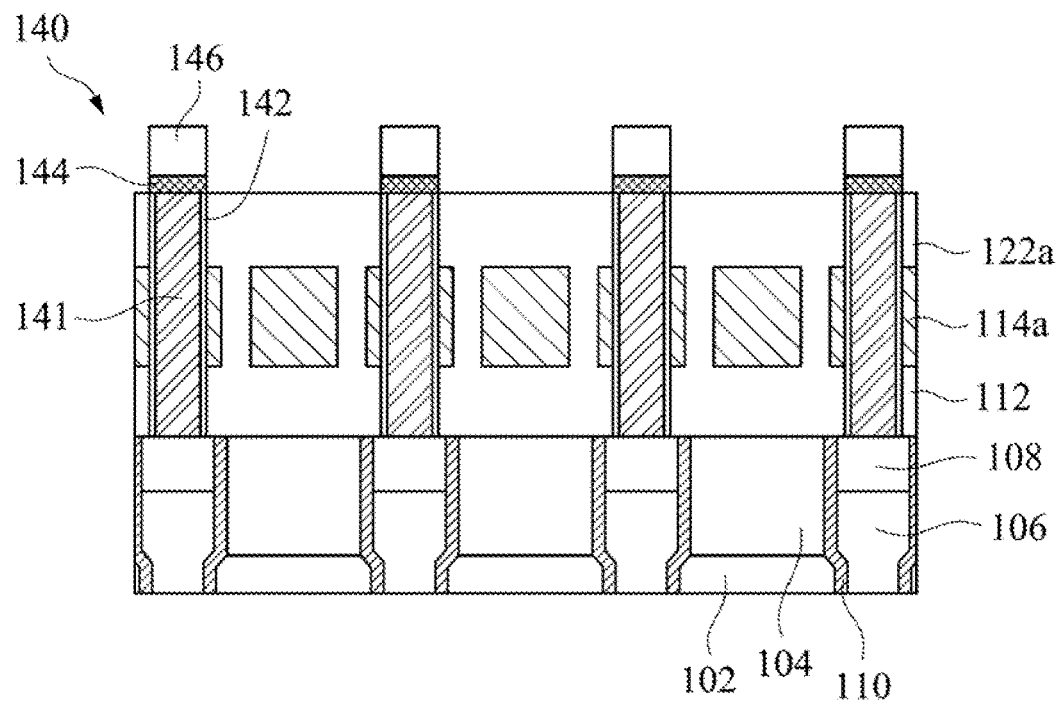
Figure 20:
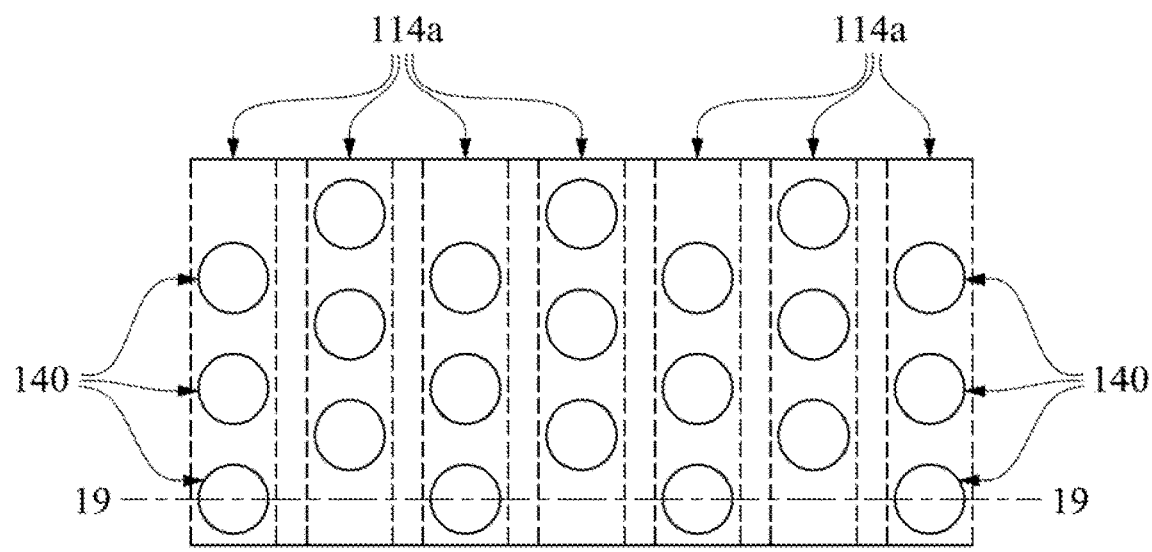
FIG. 20 illustrates a partial top view associated with FIG. 19 according to some embodiments of the present disclosure.

Reference is made to FIGS. 19-20, FIG. 20 illustrates a partial top view associated with FIG. 19 according to some embodiments of the present disclosure, and FIG. 19 illustrates a partial cross sectional view taken along the line 19-19 in FIG. 20. An upper portion of each memory cell 140 is formed in each opening 136. The upper portion of each memory cell 140 includes an indium gallium zinc oxide (IGZO) layer 141, a top indium tin oxide layer 144 and a landing pad 146. The IGZO layer 141 is sandwiched between the bottom indium tin oxide layer 108 and the top indium tin oxide layer 144. A gate oxide layer 142 is formed to surround a sidewall of the IGZO layer 141 and configured to space the IGZO layer 141 from a corresponding word line 114a. In some embodiments of the present disclosure, the top indium tin oxide layer 144 may be deposited by any suitable method, such as PVD or plasma-enhanced PVD. In some embodiments of the present disclosure, the gate oxide layer 142 may be a silicon oxide layer. In some embodiments of the present disclosure, the gate oxide layer 142 may include at least one of hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide. In some embodiments of the present disclosure, the landing pad 146 may be formed using metals and/or metal alloys such as aluminum (Al), titanium (Ti), cobalt (Co), silver (Ag), gold (Au), copper (Cu), nickel (Ni), chromium (Cr), hafnium (Hf), ruthenium (Ru), tungsten (W), platinum (Pt), alloys thereof, or the like. In some embodiments of the present disclosure, the landing pad 146 may be deposited by any suitable method, such as PVD or plasma-enhanced PVD.

In sum, the semiconductor memory device manufacturing method disclosed herein using oxide and nitride spacers around the polysilicon pillars to define word line metal layers. The nitride spacers may be formed using an atomic layer deposition process to control a layer thickness precisely. An enhanced self-aligned word line process utilizes different material spacers to precisely pattern word line metal layers to form separate word lines with balanced widths.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A semiconductor memory device manufacturing method comprising:
   sequentially forming a lower oxide layer, a word line metal layer and an upper oxide layer over at least a portion of a memory cell;
   forming at least one through hole passing through the upper oxide layer, the word line metal layer and the lower oxide layer to expose the portion of the memory cell;
   forming at least one sacrificial pillar into the at least one through hole;
   removing the upper oxide layer to expose a top portion of the at least one sacrificial pillar;
   sequentially forming a first oxide spacer sidewall, a nitride spacer sidewall and a second oxide spacer sidewall on a sidewall of the top portion of the at least one sacrificial pillar;
   removing the nitride spacer sidewall to form a void gap; and
   etching the word line metal layer through the void gap to form separate word lines.

2. The method of claim 1, wherein the nitride spacer sidewall is disposed between the first oxide spacer sidewall and the second oxide spacer sidewall.

3. The method of claim 1, wherein the first oxide spacer sidewall is disposed between the nitride spacer sidewall and the sidewall of the top portion of the at least one sacrificial pillar.

4. The method of claim 1, wherein the nitride spacer sidewall is formed by using an atomic layer deposition process.

5. The method of claim 1, wherein the word line metal layer comprises tungsten.

6. The method of claim 1, wherein the at least one sacrificial pillar comprises polysilicon.

7. The method of claim 1, further comprising:
   removing the at least one sacrificial pillar to expose the portion of the memory cell; and
   forming another portion of the memory cell to join the portion of the memory cell.

8. The method of claim 7, wherein the memory cell comprises an indium gallium zinc oxide layer.

9. The method of claim 7, wherein the memory cell comprises an indium gallium zinc oxide layer disposed between two indium tin oxide layers.

10. The method of claim 1, wherein the word line metal layer is formed to have a thickness ranging from 40 nanometers to 50 nanometers.

11. A semiconductor memory device manufacturing method comprising:
    sequentially forming a lower oxide layer, a word line metal layer and an upper oxide layer over lower portions of a plurality of memory cells;
    forming through holes passing through the upper oxide layer, the word line metal layer and the lower oxide layer to expose the lower portions of the plurality of memory cells respectively;
    forming sacrificial pillars into the through holes respectively;
    removing the upper oxide layer to expose top portions of the sacrificial pillars;
    sequentially forming first oxide spacer sidewalls and nitride spacer sidewalls on sidewalls of the top portions of the sacrificial pillars;
    forming second oxide spacer sidewalls to fill in first void gaps between adjacent-two of the nitride spacer sidewalls;
    removing the nitride spacer sidewalls to form second void gaps; and
    etching the word line metal layer through the second void gaps to form separate word lines.

12. The method of claim 11, wherein each nitride spacer sidewall is disposed between an immediately-adjacent one of the first oxide spacer sidewalls and an immediately-adjacent one of the second oxide spacer sidewalls.

13. The method of claim 11, wherein each first oxide spacer sidewall is disposed between an immediately-adjacent one of the nitride spacer sidewalls and an immediately-adjacent one of the sidewalls of the top portions of the sacrificial pillars.

14. The method of claim 11, wherein the nitride spacer sidewalls are formed by using an atomic layer deposition process.

15. The method of claim 11, wherein the word line metal layer comprises tungsten.

16. The method of claim 11, wherein the sacrificial pillars comprise polysilicon.

17. The method of claim 11, further comprising:
    removing the sacrificial pillars to expose the lower portions of the plurality of memory cells; and forming upper portions of the plurality of memory cells to join the lower portions of the plurality of memory cells respectively.

18. The method of claim 17, wherein each memory cell comprises an indium gallium zinc oxide layer.

19. The method of claim 17, wherein each memory cell comprises an indium gallium zinc oxide layer disposed between two indium tin oxide layers.

20. The method of claim 11, wherein the word line metal layer is formed to have a thickness of about 46 nanometers.

* * * * *